(12) United States Patent
Dunton et al.

(10) Patent No.: US 7,790,607 B2
(45) Date of Patent: Sep. 7, 2010

(54) METHOD FOR REDUCING DIELECTRIC OVERETCH USING A DIELECTRIC ETCH STOP AT A PLANAR SURFACE

(75) Inventors: Samuel V. Dunton, San Jose, CA (US); Usha Raghuram, San Jose, CA (US); Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 279 days.

(21) Appl. No.: 11/923,687

(22) Filed: Oct. 25, 2007

(65) Prior Publication Data

US 2008/0254615 A1 Oct. 16, 2008

Related U.S. Application Data

(62) Division of application No. 11/090,526, filed on Mar. 25, 2005, now Pat. No. 7,422,985.

(51) Int. Cl.
*H01L 21/4763* (2006.01)

(52) U.S. Cl. .................. 438/634; 438/622; 438/626; 438/631; 438/633; 257/E21.576; 257/E21.58; 257/E21.585

(58) Field of Classification Search .......... 438/622, 438/626, 631, 633, 634, 697; 257/E21.215, 257/E21.576, E21.579, E21.58, E21.585, 257/E27.073
See application file for complete search history.

(56) References Cited

U.S. PATENT DOCUMENTS

| | | | |
|---|---|---|---|
| 4,499,557 A | 2/1985 | Holmberg et al. | |
| 4,646,266 A | 2/1987 | Ovshinsky et al. | |
| 5,244,837 A | 9/1993 | Dennison | |
| 5,612,254 A | 3/1997 | Mu et al. | |
| 5,915,167 A | 6/1999 | Leedy | |
| 5,926,732 A | 7/1999 | Matsuura | |
| 6,034,882 A | 3/2000 | Johnson | |

(Continued)

FOREIGN PATENT DOCUMENTS

TW       511233       11/2002

(Continued)

OTHER PUBLICATIONS

Office Action of Taiwan Application No. 095110471 issued Oct. 15, 2008.

(Continued)

*Primary Examiner*—Matthew C Landau
*Assistant Examiner*—Colleen E Snow
(74) *Attorney, Agent, or Firm*—Dugan & Dugan, PC

(57) ABSTRACT

A substantially planar surface coexposes conductive or semiconductor features and a dielectric etch stop material. A second dielectric material, different from the dielectric etch stop material, is deposited on the substantially planar surface. A selective etch etches a hole or trench in the second dielectric material, so that the etch stops on the conductive or semiconductor feature and the dielectric etch stop material. In a preferred embodiment the substantially planar surface is formed by filling gaps between the conductive or semiconductor features with a first dielectric such as oxide, recessing the oxide, filling with a second dielectric such as nitride, then planarizing to coexpose the nitride and the conductive or semiconductor features.

37 Claims, 13 Drawing Sheets

U.S. PATENT DOCUMENTS

| | | | |
|---|---|---|---|
| 6,072,237 | A | 6/2000 | Jang et al. |
| 6,162,722 | A | 12/2000 | Hsu |
| 6,258,712 | B1 | 7/2001 | Wang |
| 6,313,018 | B1 | 11/2001 | Wang et al. |
| 6,395,639 | B1 * | 5/2002 | Esry et al. ............... 438/706 |
| 6,472,308 | B1 | 10/2002 | Mehta |
| 6,881,994 | B2 | 4/2005 | Lee et al. |
| 6,946,719 | B2 | 9/2005 | Petti et al. |
| 0,221,200 | A1 | 10/2005 | Chen |
| 6,952,030 | B2 | 10/2005 | Herner et al. |
| 7,005,350 | B2 | 2/2006 | Walker et al. |
| 7,063,597 | B2 | 6/2006 | Prabhu et al. |
| 7,172,840 | B2 | 2/2007 | Chen |
| 7,176,064 | B2 * | 2/2007 | Herner ............... 438/131 |
| 7,224,013 | B2 | 5/2007 | Herner |
| 7,285,464 | B2 | 10/2007 | Herner |
| 7,422,985 | B2 | 9/2008 | Dunton et al. |
| 7,521,353 | B2 | 4/2009 | Petti |
| 2003/0057457 | A1 | 3/2003 | Yamada et al. |
| 2003/0109123 | A1 | 6/2003 | Orita |
| 2004/0142640 | A1 | 7/2004 | Prabhu et al. |
| 2004/0214425 | A1 | 10/2004 | Lin et al. |
| 2005/0012119 | A1 | 1/2005 | Herner et al. |
| 2005/0012120 | A1 | 1/2005 | Herner et al. |
| 2005/0012154 | A1 | 1/2005 | Herner et al. |
| 2005/0012220 | A1 | 1/2005 | Vyvoda et al. |
| 2005/0014322 | A1 | 1/2005 | Herner et al. |
| 2005/0014334 | A1 | 1/2005 | Herner et al. |
| 2005/0029664 | A1 | 2/2005 | Cho et al. |
| 2005/0052915 | A1 | 3/2005 | Herner et al. |
| 2005/0101227 | A1 * | 5/2005 | Balijepalli et al. ............ 451/41 |
| 2005/0130352 | A1 | 6/2005 | Maldei et al. |
| 2006/0067117 | A1 | 3/2006 | Petti |
| 2009/0142921 | A1 | 6/2009 | Petti |

FOREIGN PATENT DOCUMENTS

| | | |
|---|---|---|
| WO | WO 99/16118 A1 | 4/1999 |
| WO | WO 2004/061851 | 7/2004 |

OTHER PUBLICATIONS

Reply to Oct. 15, 2008 Office Action of Taiwan Application No. 095110471.

International Search Report and Written Opinion of International Application No. PCT/US2006/010757 mailed Oct. 9, 2006.

International Preliminary Report on Patentbility of International Application No. PCT/US2006/010757 issued Sep. 25, 2007.

Notice of Allowance of U.S. Appl. No. 11/090,526 issued May 8, 2008.

Office Action of U.S. Appl. No. 11/090,526 mailed Oct. 25, 2007.

Reply to Oct. 25, 2007 Office Action of U.S. Appl. No. 11/090,526.

Subbanna et al., "A Novel Borderless Contact/Interconnect Technology Using Aluminum Oxide Etch Stop for High Performance SRAM and Logic", IEDM Tech. Digest, 1993, pp. 441-444.

Helm, et al, "A Low Cost, Microprocessor Compatible, 18.4 um2, 6-T Bulk Cell Technology for High Speed SRAMs", in VLSI Technology Symposium Proceedings, 1993.

Koga et al., "Two-Dimensional Borderless Contact Pad Technology for a 0.135 um2 4-Gigabit DRAM Cell," in IEDM Tech. Digest, 1997, pp. 25-28.

Norishima et al., "Fully Integrated Multilevel Interconnect Process for Sub-Half-Micron ASIC Applications," in VLSI Technology Symposium Proceedings, 1995, pp. 47-49.

Herner, S. Brad, U.S. Appl. No. 10/326,470 filed Dec. 19, 2002.

* cited by examiner

METHOD FOR REDUCING DIELECTRIC OVERETCH USING A DIELECTRIC ETCH STOP AT A PLANAR SURFACE

RELATED APPLICATIONS

This application is related to Petti, "Method for Reducing Dielectric Overetch When Making Contact to Conductive Features," U.S. application Ser. No. 11/089,771, filed on even date herewith and hereby incorporated by reference.

BACKGROUND OF THE INVENTION

The invention relates to a method for reducing dielectric overetch when making contact to conductive features, where those conductive features are interspersed with a dielectric material in a substantially planar surface. The method makes use of etch selectivities between different dielectric materials.

In semiconductor devices, it is known to etch through a dielectric material to make electrical contact to a conductive or semiconductor feature which is covered by the dielectric material. Electrical contact may be made by way of a via, for example, or by formation of a conductor formed by a damascene method.

The etch is ideally aligned with the buried conductive or semiconductor feature. The etchant is generally selective between the dielectric material being etched and the material of the conductive or semiconductor feature, preferentially etching the dielectric material while etching the material of the conductive or semiconductor very slowly or not at all, and thus will stop when the conductive or semiconductor feature is reached. If the etch is misaligned, some portion of the etched region may not fall on the conductive or semiconductor feature, instead continuing into fill dielectric, and excessive overetch may occur in this misaligned region.

Some designs and devices may have particularly limited tolerance for dielectric overetch. There is a need, therefore, to etch through dielectric material to form electrical contacts to buried conductive or semiconductor features without compromising device performance or risking excessive overetch.

SUMMARY OF THE PREFERRED EMBODIMENTS

The present invention is defined by the following claims, and nothing in this section should be taken as a limitation on those claims. In general, the invention is directed to a method to prevent excessive dielectric overetch when making electrical contact to conductive or semiconductor features.

A first aspect of the invention provides for a method for reducing dielectric overetch, the method comprising: forming a substantially planar surface, wherein the planar surface coexposes conductive or semiconductor features and a dielectric etch stop layer; depositing second dielectric fill directly on the planar surface; and etching a void in the second dielectric fill, wherein the etch is selective between the second dielectric fill and the dielectric etch stop layer, wherein the etch stops on the dielectric etch stop layer.

A preferred embodiment of the invention provides for a method for reducing dielectric overetch, the method comprising: forming a first surface, wherein the first surface coexposes conductive or semiconductor features and first dielectric fill; etching to recess the first dielectric fill relative to the conductive or semiconductor features; depositing a dielectric etch stop layer on the first dielectric fill and conductive or semiconductor features; planarizing to form a substantially planar surface, wherein the substantially planar surface coexposes the conductive or semiconductor features and the dielectric etch stop layer; depositing second dielectric fill on the planar surface; and etching a void in the second dielectric fill wherein the etch is selective between the second dielectric fill and the dielectric etch stop layer, wherein the etch stops on the dielectric etch stop layer.

Another aspect of the invention provides for a method for forming first conductors above first pillars, the method comprising: forming a substantially planar surface, the substantially planar surface coexposing first pillars and a first dielectric material between the first pillars; depositing a second dielectric material on the planar surface; etching a plurality of trenches in the second dielectric material, wherein the etch is selective between the first dielectric material and the second dielectric material; and forming the first conductors in the trenches.

Another preferred embodiment of the invention provides for a method for minimizing dielectric overetch in a monolithic three dimensional memory array, the method comprising: forming a first memory level by a method comprising: forming first bottom conductors; forming first pillars above the first bottom conductors, the first pillars separated by a first dielectric material; depositing a second dielectric material on the first pillars; etching trenches in the second dielectric material, wherein the etch is selective between the first dielectric material and the second dielectric material; and forming first top conductors in the trenches; and monolithically forming at least a second memory level above the first memory level.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 4b is a cross-sectional view, while FIGS. 4a and 4c are perspective views.

FIG. 6e is a perspective view; the others are cross-sectional views.

DETAILED DESCRIPTION OF THE PREFERRED EMBODIMENTS

Figure 1A:
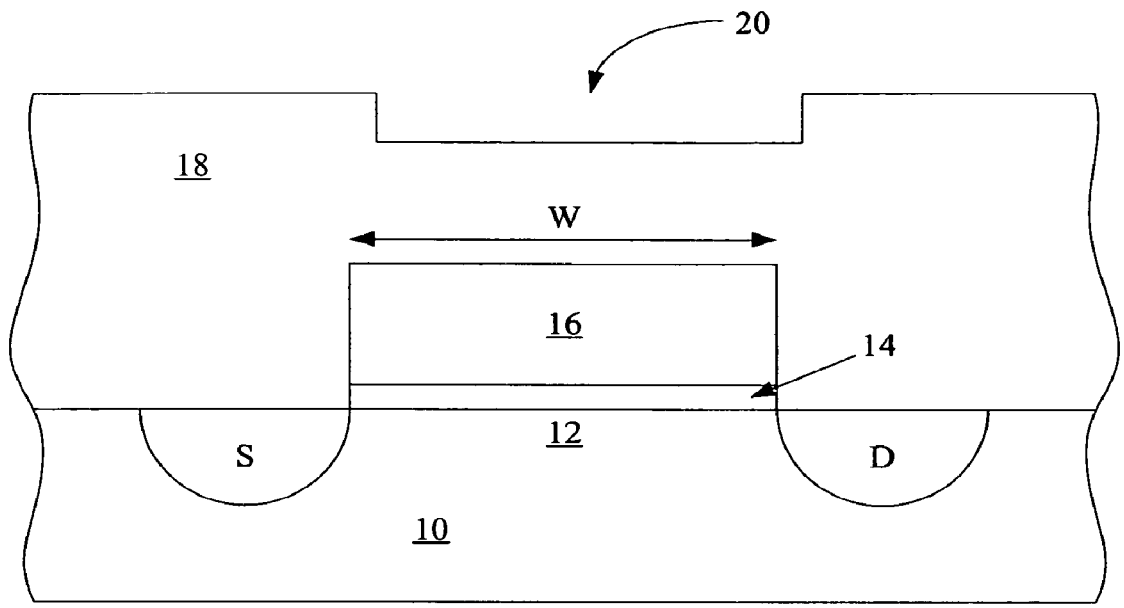
FIGS. 1a and 1b are cross-sectional views illustrating dielectric overetch due to misalignment in a prior art device.

In semiconductor devices it is often necessary to make electrical connection to a conductive or semiconductor feature which has been covered by a dielectric material. Turning to FIG. 1a, suppose, for example, a field effect transistor is formed having channel region 12 formed in a monocrystalline wafer 10, source S and drain D, gate oxide 14, and gate 16. In this example, gate 16 is formed of doped polycrystalline silicon. In this discussion, polycrystalline silicon will be referred to as polysilicon. The transistor is formed and covered with dielectric material 18, for example silicon dioxide. Electrical connection must be made to polysilicon gate 16. The width W of polysilicon gate may be the feature size, the minimum size of a patterned feature or gap that can be formed in a semiconductor device. The feature size is limited by photolithographic and other constraints. FIG. 1a shows early stages of an etch step in which a void 20 is etched in dielectric 18. In this example the width of void 20 is also W, the feature size. It will be seen that void 20 and polysilicon gate 16 are slightly misaligned.

Figure 1B:
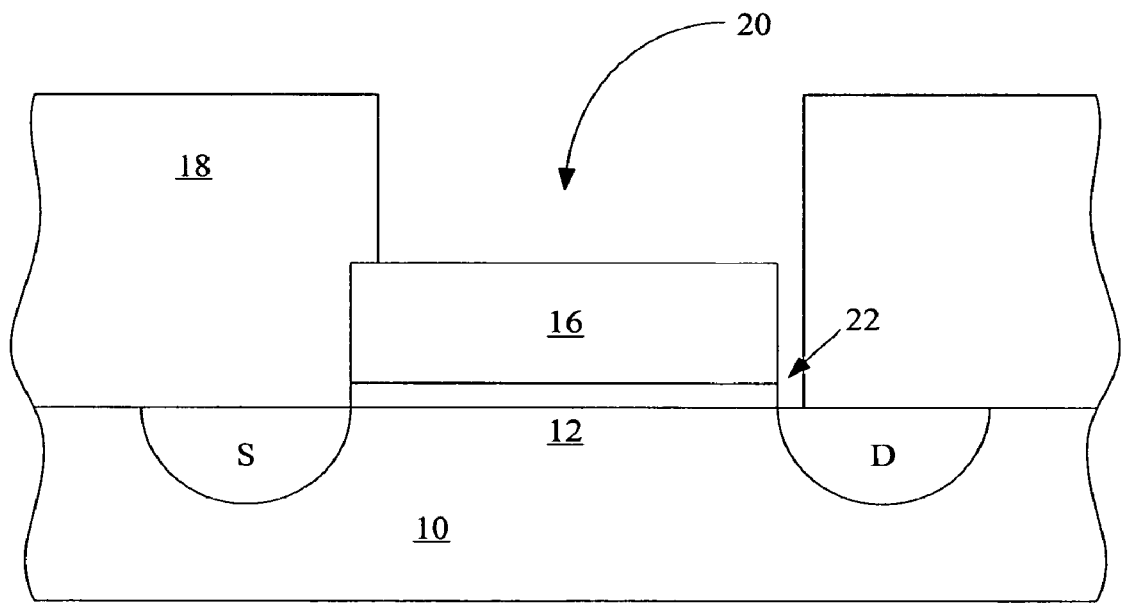

As the etch continues, as shown in FIG. 1b, the etch reaches polysilicon gate 16. The etchant is chosen to be selective, such that the etch stops at polysilicon gate 16, and polysilicon gate 16 itself is etched minimally or not at all. Due to slight misalignment, however, a portion of the etch does not fall on polysilicon gate 16, and the etch continues, creating an overetch 22 which reaches drain D. A contact formed in void 20 will short gate 16 to drain D.

Figure 2A:
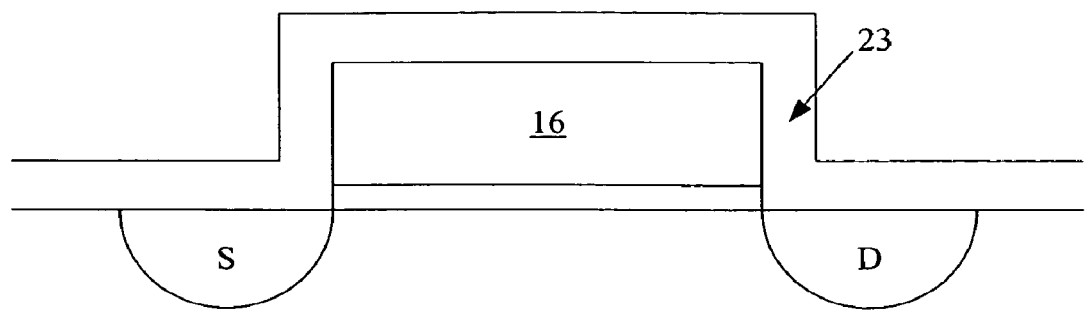
FIGS. 2a-2c are cross-sectional views illustrating use of spacers to prevent dielectric overetch in a prior art device.
Figure 2B:
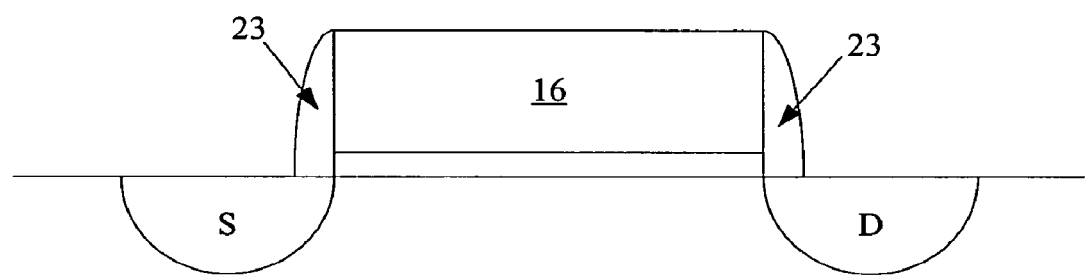
Figure 2C:
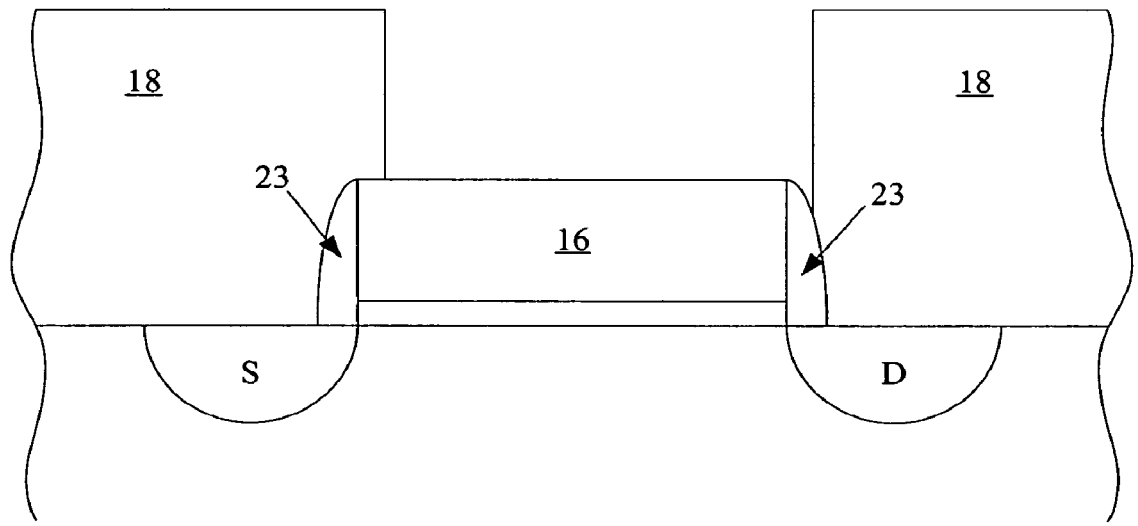

A common way to improve misalignment tolerance during a contact etch is to form spacers. For example, as shown in FIG. 2a, after formation of the transistor, a thin layer 23 of a different dielectric material, for example silicon nitride, is deposited over polysilicon gate 16. An anisotropic etch follows, which preferentially etches vertically, with very little or no side-etching. The anisotropic etch removes silicon nitride from horizontal surfaces, leaving spacers 23, as shown in FIG. 2b. Turning to FIG. 2c, silicon dioxide 18 covers polysilicon gate 16. When an etch is performed to form a contact to gate 16, the etch may be slightly misaligned, as shown. Spacers 23, though, effectively widen the gate, and etchants may be used that are highly selective, etching silicon dioxide 18 at a high rate, while etching both silicon nitride spacers 23 and polysilicon gate 16 at a very low rate.

A monolithic three dimensional memory array is described in Herner et al., U.S. patent application Ser. No. 10/326,470, "An Improved Method for Making High Density Nonvolatile Memory," filed Dec. 19, 2002, since abandoned, hereinafter the '470 application and hereby incorporated by reference. Related memories are described in Herner, U.S. patent application Ser. No. 10/955,549, "Nonvolatile Memory Cell Without a Dielectric Antifuse Having High- and Low-Impedance States," filed Sep. 29, 2004, hereinafter the '549 application; in Herner et al. U.S. patent application Ser. No. 10/954,577, "Junction Diode Comprising Varying Semiconductor Compositions," filed Sep. 29, 2004, hereinafter the '577 application; and in Herner et al., U.S. patent application Ser. No. 11/015,824, "Nonvolatile Memory Cell Comprising a Reduced Height Vertical Diode," filed Dec. 17, 2004, hereinafter the '824 application, all hereby incorporated by reference.

Figure 3:
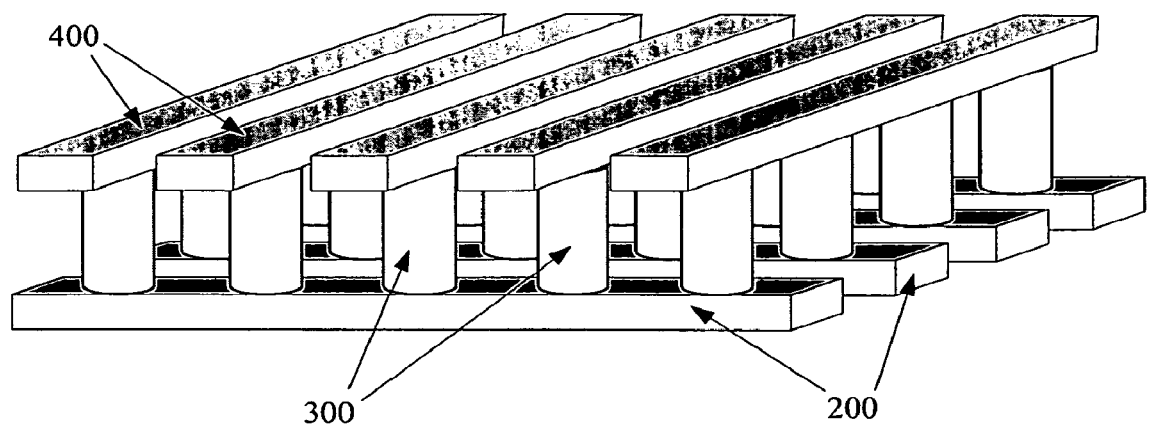
FIG. 3 is a perspective view of a memory level in a monolithic three dimensional memory array.

In the memories described in the '470 and related applications, multiple memory levels are formed above a substrate, the levels stacked on top of each other. As shown in FIG. 3, one of these memory levels includes bottom conductors 200, pillars 300, and top conductors 400. Conductors may be shared between vertically adjacent memory levels, or the levels may be separated by an interlevel dielectric. Each pillar 300 includes a vertically oriented junction diode, which in some embodiments is formed in series with a dielectric rupture antifuse between the top and bottom conductors. Each memory cell includes a pillar 300 and a portion of one of the bottom conductors 200 and one of the top conductors 400. A memory cell is formed in an initial high-resistance state, in which very little current flows when a read voltage is applied between the top and bottom conductors. Application of a relatively large programming voltage between the top and bottom conductors converts a memory cell to a low-resistance state, in which a measurably higher level of current flows when a read voltage is applied.

In preferred embodiments of the '470, '549, '577, and '824 applications, the top conductors 400 are formed by a subtractive method: A conductive stack (for example titanium nitride and tungsten) is deposited, then patterned and etched to form a plurality of substantially parallel, substantially coplanar conductors. Gaps between the conductors are then filled with a dielectric material.

In some embodiments, however, it may be preferred to form top conductors by a damascene method instead. In damascene methods of fabrication, a dielectric material is deposited, trenches are etched in the dielectric, and the trenches filled with conductive material. The overfill of conductive material is removed, for example by chemical mechanical planarization (CMP), leaving behind conductive lines isolated by dielectric.

Figure 4A:
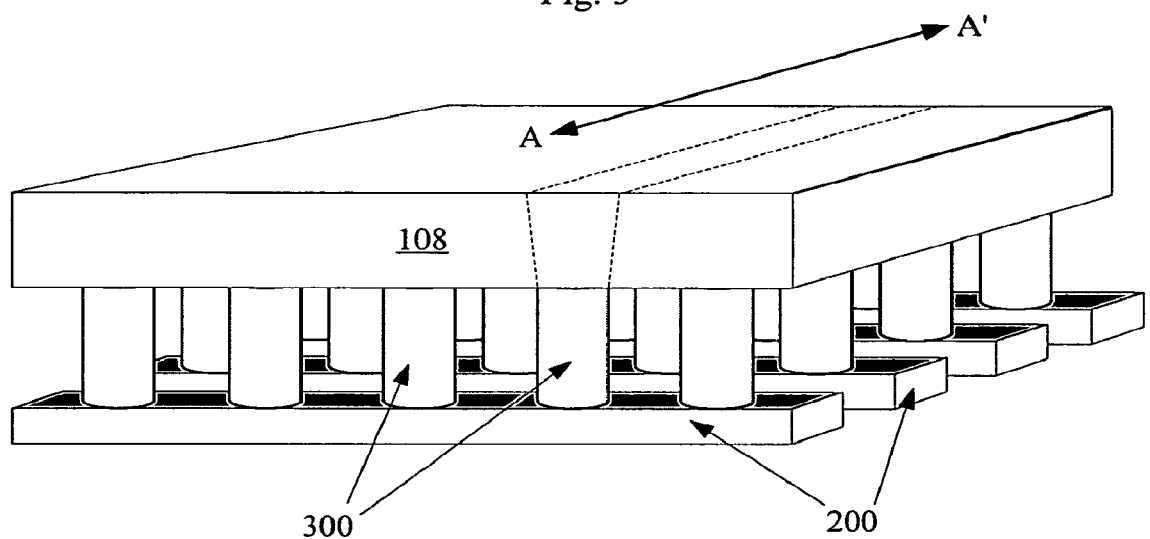
FIGS. 4a-4c illustrate stages in formation of a memory level in which the top conductors are formed by a damascene method.

In certain designs, there may be limited tolerance for overetch during the dielectric etch required by damascene methods. FIG. 4a shows a stage in formation of a memory level like those of the '470, '549, '577, and '842 applications, including bottom conductors 200 and pillars 300; top conductors 400 have not yet been formed. Silicon dioxide 108 fills gaps between pillars 300 and has been deposited in a relatively thick layer over pillars 300. (To avoid obscuring pillars 200, fill 108 between pillars 200 is not shown.) In this embodiment, top conductors 400 will be formed by a damascene method: To form each conductor a trench will be etched in silicon dioxide 108, then conductive material deposited in the trenches.

Silicon dioxide 108 was deposited over the entire wafer surface, and the etch to form trenches will similarly be performed across the entire wafer surface in a single etch step. Neither deposition nor etch of silicon dioxide takes place at a uniform rate across the wafer. Thus during the etch step to form trenches the tops of some pillars 300 will be exposed by the etch while others are still covered with some remaining thickness of silicon dioxide 108. The etch must continue past this point until tops of all of the pillars 300 are exposed; thus by the time the tops of the last pillars are exposed, there will unavoidably be recessing of silicon dioxide 108 relative to the earlier-exposed pillars. Dotted lines in FIG. 4a indicate where a trench is to be formed (in fact a trench is to be formed over each row of pillars 200, but, for simplicity, the location of only one trench is indicated in FIG. 4a.)

Figure 4B:
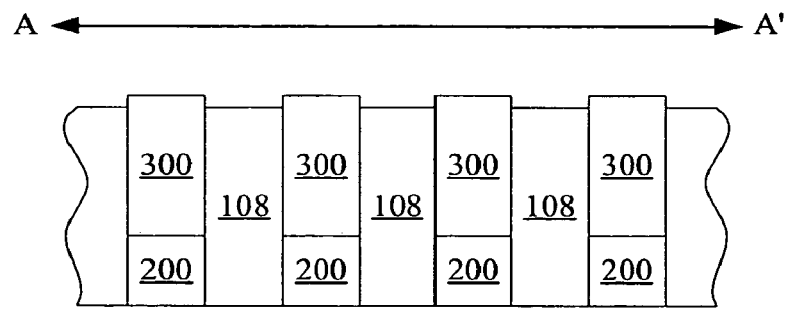

FIG. 4b shows a cross section along line A-A' of FIG. 4a after the oxide etch to form trenches, in a region of the wafer in which the silicon dioxide 108 is recessed relative to the pillars 300 following the oxide etch. FIG. 4b shows silicon dioxide fill 108 between pillars 200; recall this fill was omitted in FIG. 4a to avoid obscuring pillars 200.

Figure 4C:
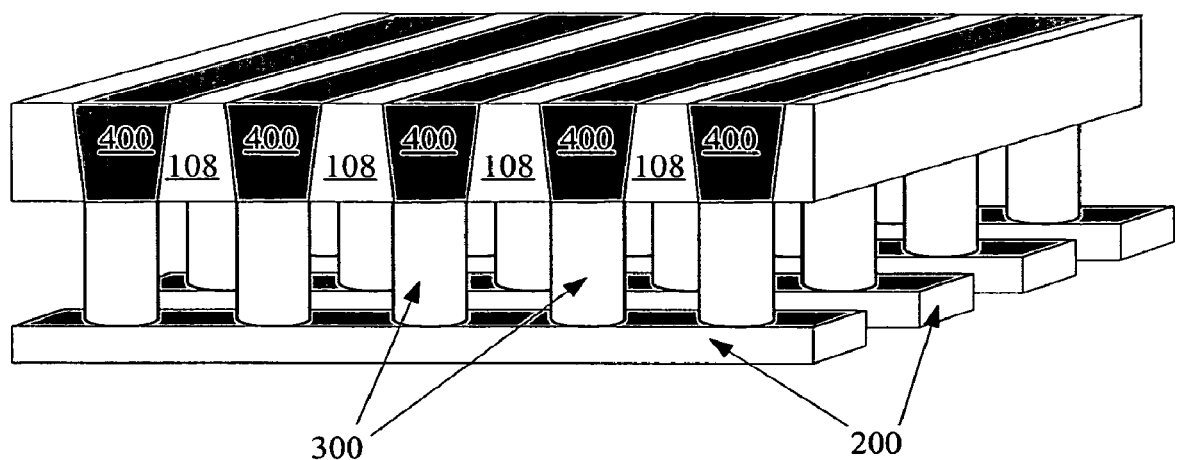

In the next step, shown in FIG. 4c, conductive material to form top conductors 400 is deposited in the etched trenches; a CMP step completes formation of conductors 400.

Figure 5A:
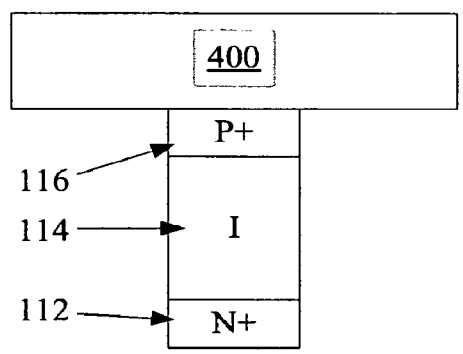
FIGS. 5a and 5b are cross-sectional views illustrating how varying degrees of overetch affect contact made to a vertically oriented diode in a memory level formed in the method of FIGS. 4a-4c.
Figure 5B:
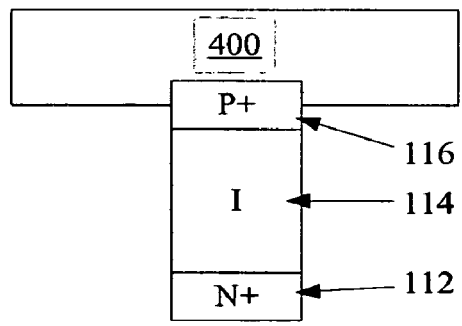

It was noted that each pillar 300 includes a semiconductor junction diode. FIGS. 5a and 5b show exemplary p-i-n diodes, made of semiconductor material, such as silicon, germanium, or their alloys. Each has a bottom region 112 heavily doped with n-type dopants, a middle region 114 which is intrinsic (undoped), and a top region 116 which is heavily doped with p-type dopants. Clearly the dopant types can be reversed. The diode of FIG. 5a is in a region of the wafer in which very little oxide recess was produced, while the diode of FIG. 5b is in a region of the wafer in which the oxide was recessed significantly more, as in FIG. 4b. Electrical connection is made to the diode of FIG. 5a and to the diode of FIG. 5b at different points within P+ region 116, causing these diodes to have different electrical performance, and potentially to create a short between P+ region 116 and intrinsic region 114. In a memory array, uniform behavior is crucial to array performance; thus this nonuniformity of oxide recess is to be avoided.

Figure 6A:
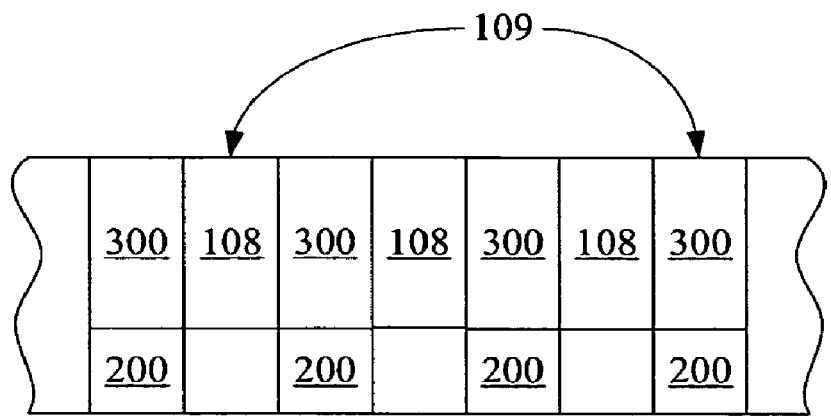
FIGS. 6a-6f illustrate stages in formation of a memory level including top conductors formed by a damascene method in which excessive dielectric overetch is prevented according to the present invention.

The methods of the present invention provide a way to avoid the oxide recess shown in FIG. 4b. Turning to FIG. 6a, pillars 300 are formed by depositing a semiconductor layer stack, then patterning and etching the layerstack to form the pillars 300. Next silicon dioxide 108 is deposited over and between them. A planarization step, for example by CMP, removes overfill, exposing the tops of the pillars 300 and creating a substantially planar surface 109. This substantially planar surface 109 coexposes silicon dioxide 108 and the pillars 300.

Figure 6B:
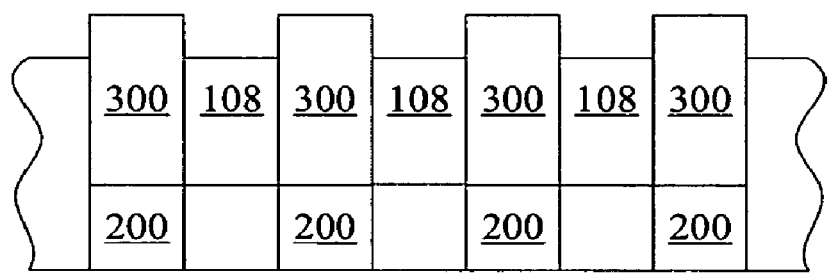
Figure 6C:
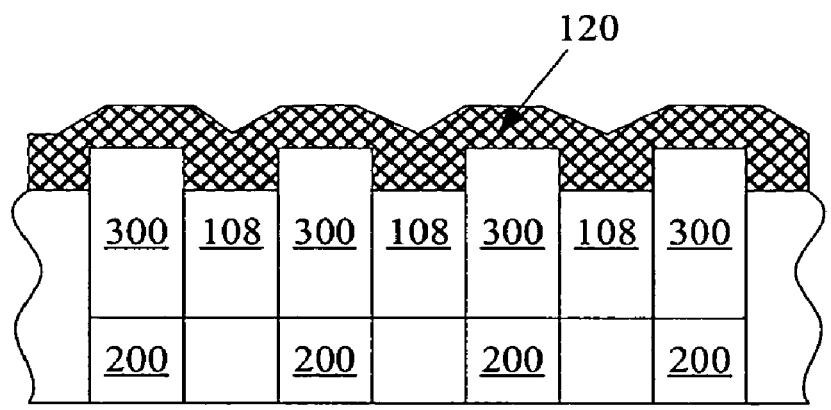
Figure 6D:
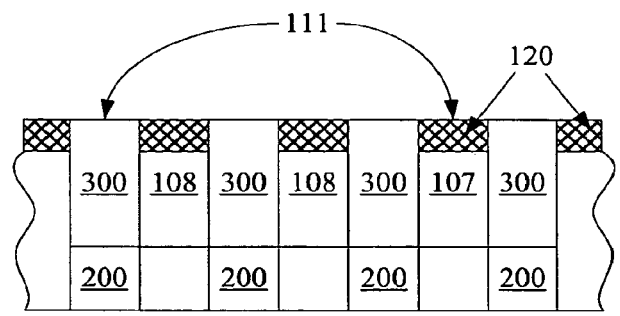
Figure 6E:
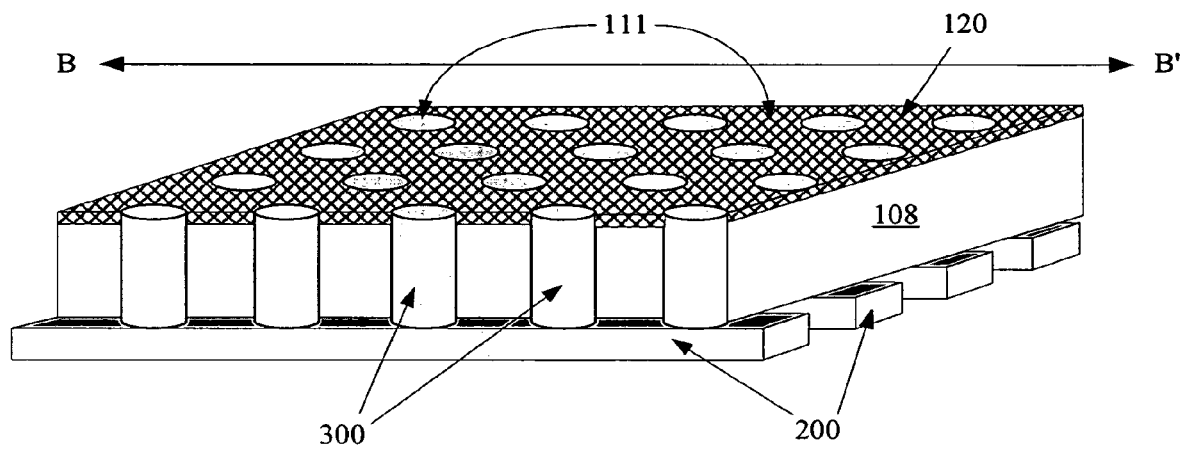

Next an etch step, for example by an HF dip, selectively overetches the oxide, producing an oxide recess across the wafer, as shown in FIG. 6b. In FIG. 6c, a second dielectric material 120, for example silicon nitride, is deposited over and between the pillars 300, filling the recess. A second planarization step, preferably by CMP, produces a substantially planar surface 111 shown in FIG. 6d. This substantially planar surface 111 coexposes silicon nitride 120 and the top surfaces of pillars 300. FIG. 6e is a perspective view of the same structure.

Next a dielectric material 107 is deposited on substantially planar surface 111. This material is preferably silicon dioxide. It is essential that it be a different dielectric material than the dielectric used for second dielectric material 120, and that there be some etch selectivity between the two dielectrics. In this example the dielectric fill 108 below the second dielectric material 120 and the dielectric fill 107 above it are the same material, silicon dioxide, but they need not be.

Figure 6F:
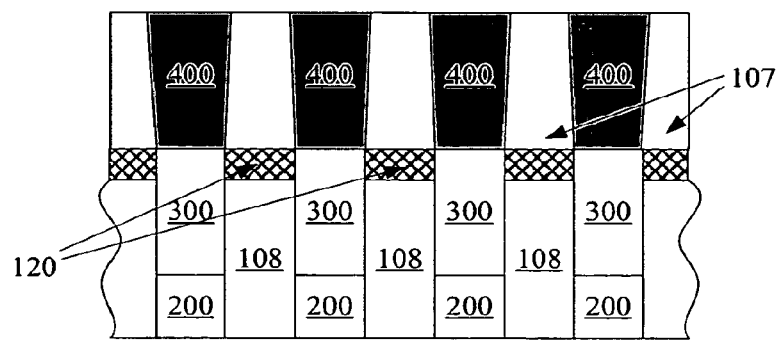

Trenches are etched in dielectric material 107 (as in FIG. 4b.) An etchant is chosen which is selective between silicon dioxide 107 and silicon nitride 120, such that silicon dioxide is etched at a significantly higher rate than silicon nitride. Thus little or no recess is produced by this etch. Turning to FIG. 6f, which is a cross section along line B-B' of FIG. 6e, to complete the conductors 400, conductive material is deposited in the trenches and overfill removed by CMP, forming conductors 400.

Many variations can be made in the steps and structures just described while the results fall within the scope of the invention. For example, the procedure just described included 1) a first CMP step to form the substantially planar surface 109 coexposing oxide 108 and pillars 300 shown in FIG. 6a, 2) an HF dip to produce an oxide recess, shown in FIG. 6b, 3) deposition of the second dielectric material 120, shown in FIG. 6c, and 4) a second CMP step to form the substantially planar surface 111 coexposing silicon nitride 120 and pillars 300, shown in FIG. 6d. This surface 111 can be formed in different ways, however.

Figure 7A:
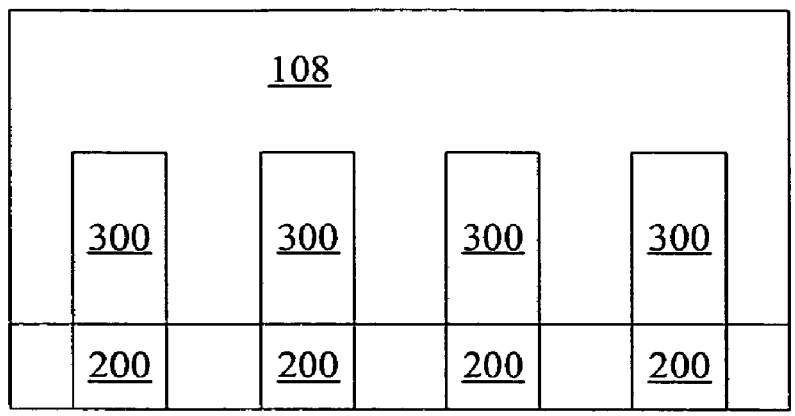
FIGS. 7a and 7b are cross-sectional views illustrating an alternate method of fabrication to create the structure of FIG. 6b.
Figure 7B:
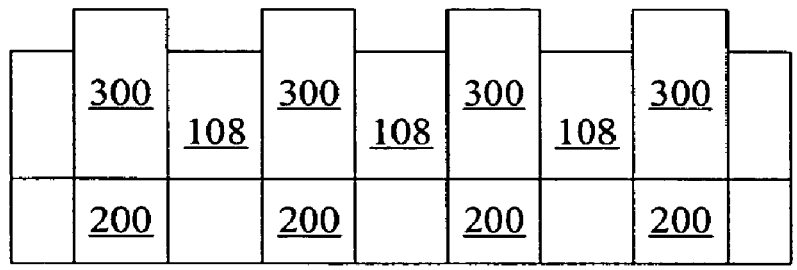

The planar surface 111 of FIG. 6a need not be formed by CMP. In one alternative embodiment, shown in FIG. 7a, after pattern and etch of pillars 300, dielectric fill 108 is deposited by a high-density plasma method. Such an HDP dielectric initially reproduces underlying topography, but when deposited to sufficient depth will tend to self-planarize, forming a substantially planar surface. This surface can then be subjected to etchback. Such an etchback process will maintain existing planarity. The etchback can be continued, forming a selective overetch until the pillars 300 are exposed and an oxide recess is created as in FIG. 7b. The structure of FIG. 7b now appears as in FIG. 6b, though the recess was produced in a different way. Other dielectrics that have the property of self-planarizing when overfilled can be substituted for silicon dioxide.

To summarize, what has been described is a method to form a surface, the method comprising forming conductive or semiconductor features; filling gaps between the conductive or semiconductor features with the first dielectric fill, wherein the first dielectric fill is HDP dielectric, wherein the HDP dielectric is overfilled to create a substantially planar HDP fill surface; and etching the substantially planar HDP fill surface to expose the conductive or semiconductor features.

Figure 8:
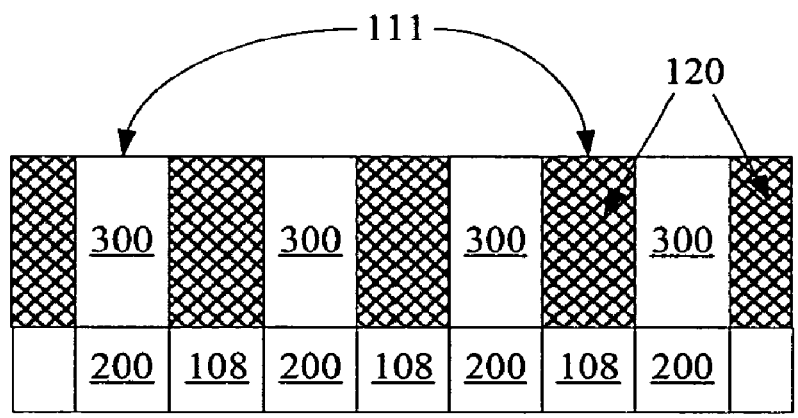
FIG. 8 is a cross-sectional view illustrating an alternative embodiment of the present invention.

In another embodiment, shown in FIG. 8, silicon nitride 120, rather than being formed in a thin layer on a thicker silicon dioxide gap fill 108, replaces silicon dioxide gap fill 108. To form this structure, after the pillars 300 are patterned and etched, silicon nitride layer 120 is deposited over and between the pillars, filling the gaps between them and covering them. A subsequent CMP step creates substantially planar surface 111 which coexposes the tops of pillars 300 and silicon nitride layer 120. This planar surface 111 is analogous to the planar surface 111 of FIG. 6d.

Each of the embodiments described so far describes a method, the method comprising forming a substantially planar surface, wherein the planar surface coexposes conductive or semiconductor features and a dielectric etch stop layer; depositing second dielectric fill directly on the planar surface; and etching a void in the second dielectric fill, wherein the etch is selective between the second dielectric fill and the dielectric etch stop layer, wherein the etch stops on the dielectric etch stop layer.

In the embodiment just described, forming the substantially planar surface comprises forming an initial surface coexposing a third dielectric material and the conductive or semiconductor features; etching to recess the third dielectric material relative to the conductive or semiconductor features; depositing the dielectric etch stop layer on the third dielectric material and the conductive or semiconductor features; and planarizing to form the substantially planar surface.

Other ways to form the substantially planar surface coexposing conductive or semiconductor features and a dielectric etch stop layer can be envisioned, all of which fall within the scope of the invention.

In the examples described so far, a substantially planar surface coexposes conductive or semiconductor features and silicon nitride, silicon dioxide is deposited on the substantially planar surface, and a trench etched in the silicon dioxide stops on the silicon nitride. Many other dielectric materials could be substituted for either silicon nitride or silicon dioxide, so long as there is some etch selectivity between the two different dielectric materials used. Possible dielectric materials are silicon carbide, silicon oxynitride, and undoped, amorphous silicon, among many others. Use of these and other dielectrics falls within the scope of the invention.

In the embodiments described so far, at the substantially planar surface which coexposes silicon nitride with conductive or semiconductor features, only silicon nitride and the conductive features are exposed. It is possible that other materials could be exposed as well, and the presence of additional material at such a surface does not place it outside the scope of the present invention.

An example will be given of a monolithic three dimensional memory array formed using embodiments of the present invention to limit or prevent dielectric overetch. For completeness, this example will include many details, including materials, dimensions, conditions, and process steps. It will be understood by those skilled in the art that many of these details can be modified, augmented, or omitted while the results still fall within the scope of the invention. This example is provided as an illustration only.

The monolithic three dimensional memory array to be described is similar to that described in the '470, '549, '577, and '824 applications. For simplicity and to avoid obscuring the invention, not all of the detail provided in those applications is included. It will be understood, however, that no teaching of any of the '470, '549, '577, or '824 applications is intended to be excluded.

Example

Fabrication of a single memory level is described. Additional memory levels can be stacked, each monolithically formed above the one below it.

Figure 9A:
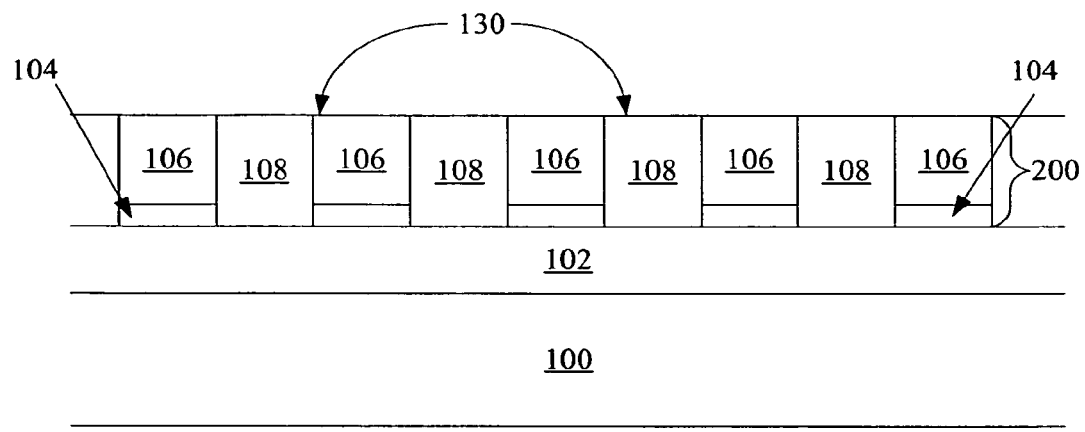
FIGS. 9a-9f are cross-sectional views illustrating stages in formation of a memory level in a monolithic three dimensional memory array using the methods of the present invention to minimize dielectric overetch.

Turning to FIG. 9a, formation of the memory begins with a substrate 100. This substrate 100 can be any semiconducting substrate as known in the art, such as monocrystalline silicon, IV-IV alloys like silicon-germanium or silicon-germanium-carbon, III-V alloys, II-VII alloys, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material. In this example, insulating layer 102 is silicon dioxide, and this layer is, for example, about 3500 angstroms thick.

The first conductors 200 are formed over insulating layer 102. An adhesion layer 104 may be included between insulating layer 102 and the conducting layer 106 to help the conducting layer 106 adhere. Preferred materials for the adhesion layer 104 are tantalum nitride, tungsten nitride, titanium tungsten, sputtered tungsten, titanium nitride, or combinations of these materials. If the overlying conducting layer 106 is tungsten, titanium nitride is preferred for use in adhesion layer 104. Adhesion layer 104 is between about 20 and about 500 angstroms thick, preferably about 200 angstroms thick.

The next layer to be deposited is conducting layer 106. Conducting layer 106 can comprise any conducting material known in the art, including tantalum, titanium, tungsten, copper, cobalt, or alloys thereof. Titanium nitride may be used. Conducting layer 106 is between about 200 and about 2000 angstroms thick, preferably about 1500 angstroms thick.

Once all the layers that will form the conductors have been deposited, the layers will be patterned and etched using any suitable masking and etching process to form substantially parallel, substantially coplanar conductors 200, shown in FIG. 9a in cross-section. In preferred embodiments, photoresist is deposited, patterned by photolithography and the layers etched, then the photoresist removed using conventional methods.

Next a dielectric material 108 is deposited over and between conductors 200. Dielectric material 108 can be any known electrically insulating material, such as silicon dioxide.

Finally, excess dielectric material 108 on top of conductors 200 is removed, exposing the tops of conductors 200 separated by dielectric material 108, and leaving a substantially planar surface 130. The resulting structure is shown in FIG. 9a. This removal of dielectric overfill to form planar surface 130 can be performed by any process known in the art, such as CMP or etchback. At this stage, a plurality of substantially parallel first conductors have been formed at a first height above substrate 100.

Alternatively conductors 200 could have been formed by a damascene method.

Figure 9B:
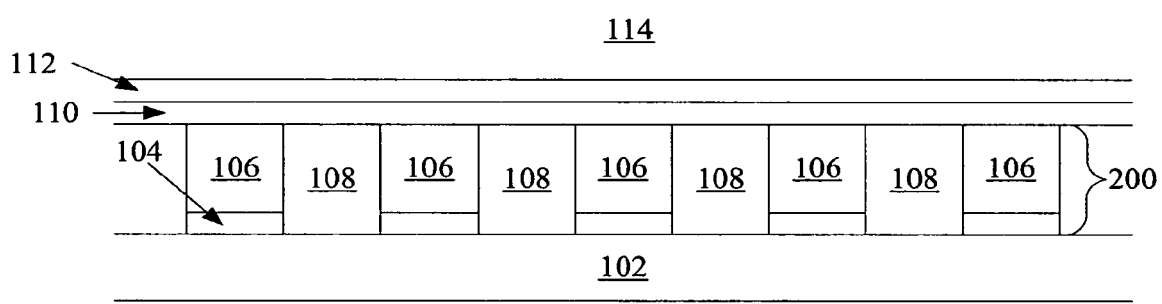

Next, turning to FIG. 9b, vertical semiconductor pillars will be formed above completed conductor rails 200. (To save space substrate 100 is omitted in FIG. 9b and subsequent figures; its presence will be assumed.) If conducting layer 106 was tungsten, it is preferred to deposit barrier layer 110, preferably of titanium nitride, after planarization of the conductor rails 200. This layer can be formed in any conventional manner. Its thickness can be, for example, about 20 to about 500 angstroms. The thickness of barrier layer 110 is preferably about 200 angstroms.

Next semiconductor material that will be patterned into pillars is deposited. The semiconductor material can be silicon, silicon-germanium, silicon-germanium-carbon, germanium, or other suitable semiconductors or alloys. Silicon is commonly used in the industry, so, for simplicity, this description will refer to the semiconductor material as silicon, but it will be understood that other materials may be substituted.

Figure 10A:
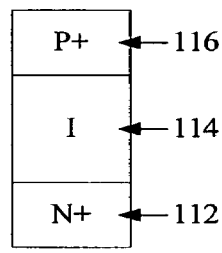
FIGS. 10a and 10b are cross-sectional views illustrating possible configurations of p-i-n diodes for use in the memory level of FIGS. 9a-9f.
Figure 10B:
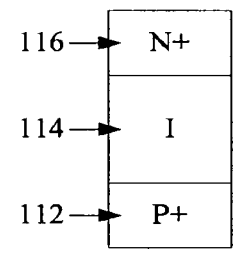

In preferred embodiments, the semiconductor pillar is a junction diode, comprising a bottom heavily doped region of a first conductivity type and a top heavily doped region of a second conductivity type. The middle region, between the top and bottom regions, is an intrinsic or lightly doped region of either the first or second conductivity type. The diode of FIG. 10a has a bottom region 112 of N+ (heavily doped n-type) silicon, intrinsic region 114, and P+ top region 116. The diode of FIG. 10b is reversed, having bottom region 112 of P+ silicon, intrinsic region 114, and N+ top region 116. Either diode could be used. The middle region is intrinsic, or not intentionally doped, though in some embodiments it may be lightly doped. An undoped region will never be perfectly electrically neutral, and will always have defects or contaminants that cause it to behave as if slightly n-doped or p-doped. Such a diode can be considered a p-i-n diode.

Returning to FIG. 9b, deposition and doping of layers 112, 114, and 116 can be achieved using many conventional methods, as described in the incorporated applications. In a preferred embodiment, heavily doped region 112 is formed by in situ doping with an n-type dopant such as phosphorus by flowing a donor gas during the silicon deposition. Once the desired thickness of layer 112 is formed, flow of the donor gas is stopped, and the rest of the desired thickness of silicon (the thicknesses of layer 114 and 116, in addition to a sacrificial thickness that will be lost in a following CMP step) is deposited undoped. In this preferred embodiment, heavily doped layer 116 is formed by an ion implantation performed later, and thus has not yet been formed at the stage depicted in FIG. 9*b* and is not shown. The total thickness of deposited silicon is preferably between about 3000 and about 4500 angstroms.

Figure 9C:
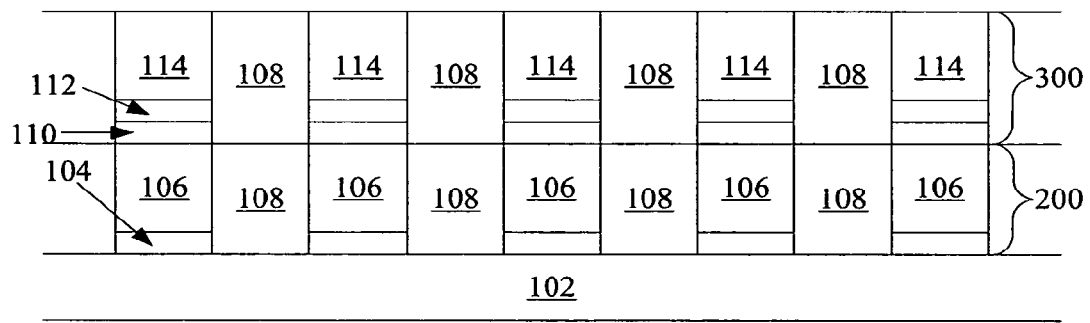

Turning to FIG. 9*c*, semiconductor layers 114 and 112 just deposited will be patterned and etched, along with barrier layer 110, to form semiconductor pillars 300. Semiconductor pillars 300 should have about the same pitch and about the same width as conductors 200 below, such that each semiconductor pillar 300 is formed on top of a conductor 200. In some embodiments the pitch is about 260 nm, while in others pitch is about 180 nm. Some misalignment can be tolerated. The semiconductor pillars 300 can be formed using any suitable masking and etching process.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon dioxide.

Next the dielectric material on top of the pillars 300 is removed, exposing the tops of pillars 300 separated by silicon dioxide 108, and leaving a substantially planar surface. This removal of silicon dioxide overfill can be performed by any process known in the art, such as CMP or etchback, specifically etchback after overfilling a self-planarizing dielectric to produce a substantially planar surface, as described earlier.

Figure 9D:
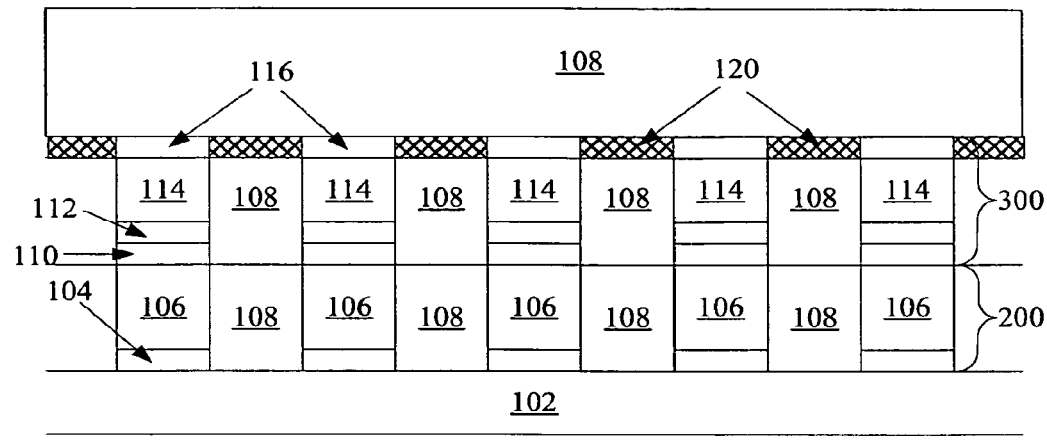

A selective etch is performed next to recess silicon dioxide 108, preferably by an HF dip that removes about 500 angstroms of silicon dioxide 108. Next, as shown in FIG. 9*d*, a second dielectric 120, preferably silicon nitride, is deposited. In one embodiment the volume of silicon nitride 120 deposited is that required to form a thickness of 1000 angstroms on a flat surface.

A CMP step follows, removing the overfill of silicon nitride 120. Preferably this CMP is performed with a slurry having abrasive particles of fumed silica ($SiO_2$) in a pH of about 10 in KOH; an example of such a slurry is Cabot SS12. In preferred embodiments, the amount of CMP sufficient to remove 400 angstroms of oxide from a wafer with no topography is an advantageous amount to create a planarized surface coexposing silicon nitride 120 and the tops of pillars 300.

In other embodiments a ceria ($CeO_2$) slurry for dielectric CMP may be used instead. It will be recalled that the thickness of silicon deposited in regions 112 and 114 assumed that some thickness, for example about 800 angstroms, of silicon would be lost during CMP. If a ceria slurry is used, little or no silicon thickness will be lost, so the total thickness deposited should be reduced accordingly.

The ion implantation of heavily doped top regions 116 should be performed at this point, in this example using a p-type dopant to form P+ regions. The CMP step formed a substantially planar surface coexposing tops of semiconductor pillars 300 and silicon nitride layer 120.

Next dielectric material 108 is deposited to a thickness of between about 4000 and about 10,000 angstroms, preferably about 5000 angstroms. Silicon dioxide is preferred for dielectric material 108, though other materials may be used. The dielectric materials used should be selected so that there is good etch selectivity between dielectric 108 and dielectric 120. An etch selectivity greater than about 4:1, preferably greater than about 10:1 is preferred between dielectric 108 and dielectric 120. FIG. 9*d* shows the structure at this point.

Figure 9E:
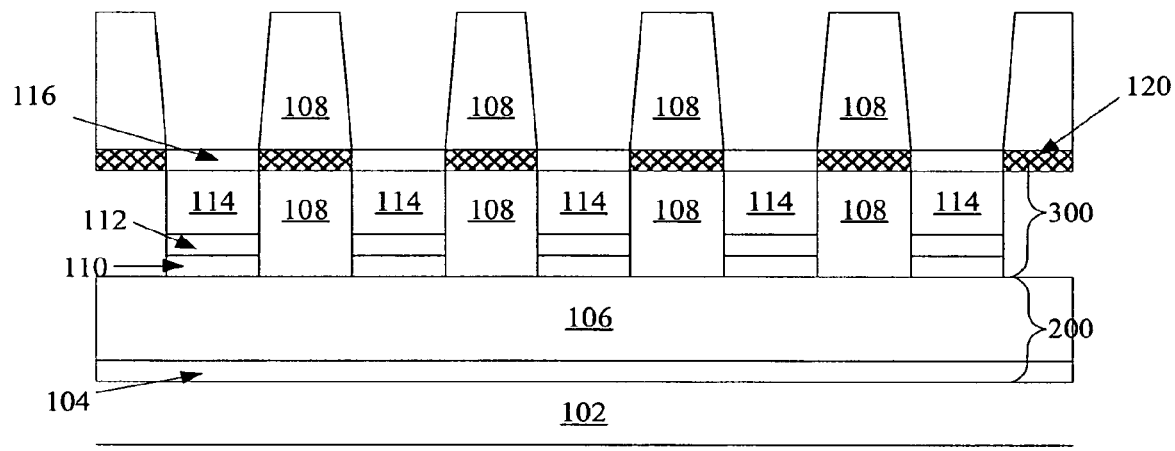

FIG. 9*e* shows the structure viewed at ninety degrees from the view of FIG. 9*d*; thus this view shows a single conductor 200 cut along its length, rather than a series in cross-section as in FIG. 9*d*. In FIG. 9*e*, trenches have been etched in silicon dioxide layer 108, preferably about the same width and pitch as the pillars 300, and aligned with them. Some misalignment can be tolerated. The trench etch will stop when it reaches pillars 300 and silicon nitride layer 120 with little or no overetch.

If desired, a dielectric layer which will function as a dielectric rupture antifuse can be formed on each pillar 300. This dielectric layer can be formed by an oxidation method, for example by thermal or plasma oxidation. Alternatively the dielectric rupture antifuse can be deposited. The layer can be silicon nitride, silicon oxide, silicon oxynitride, or any other suitable dielectric material. This dielectric rupture antifuse is not present in all embodiments and is not shown in FIG. 9*e*.

Figure 9F:
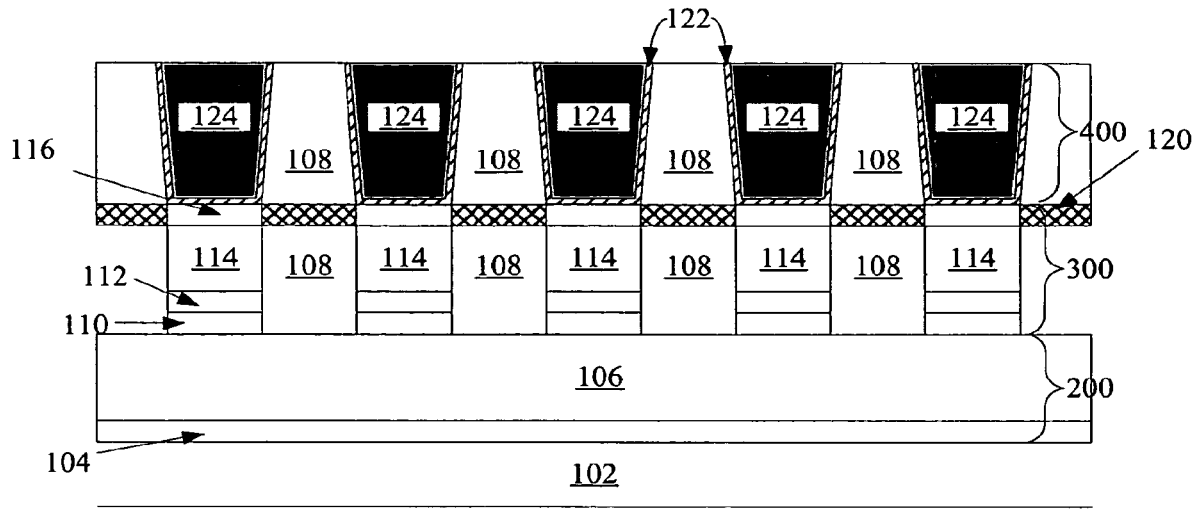

Next, turning to FIG. 9*f*, conductive material, preferably including a thin barrier layer 122, preferably titanium nitride, and a conductive layer 124, preferably tungsten, is deposited, filling the trenches and covering silicon dioxide 108. Barrier layer 122 is preferably between about 20 and about 1000 angstroms thick, most preferably about 100 angstroms thick. To form conductive layer 124, between about 1000 angstroms and about 5000 angstroms of tungsten is deposited, preferably about 2000 angstroms, filling the trench and producing some overfill. A CMP step removes the titanium nitride and tungsten overfill, leaving top conductors 400. Note the dimensions of each conductor 400 are constrained by the size of the trench in which it is formed. The width of the trench is preferably about the same width as the pillar 300 (for example about 90 or about 130 nm), while its height is the height of silicon dioxide layer 108 after CMP, preferably between about 4000 and about 5000 angstroms.

To summarize, a method has been described to reduce dielectric overetch, the method comprising forming a first surface, wherein the first surface coexposes conductive or semiconductor features and first dielectric fill; etching to recess the first dielectric fill relative to the conductive or semiconductor features; depositing a dielectric etch stop layer on the first dielectric fill and conductive or semiconductor features; planarizing to form a substantially planar surface, wherein the substantially planar surface coexposes the conductive or semiconductor features and the dielectric etch stop layer; depositing second dielectric fill on the planar surface; and etching a void in the second dielectric fill wherein the etch is selective between the second dielectric fill and the dielectric etch stop layer, wherein the etch stops on the dielectric etch stop layer.

Top conductors 400 will extend in a different direction from bottom conductors 200, preferably substantially perpendicular to them. Each memory cell comprises a portion of one of the first conductors 200, one of the first pillars 300, one of the dielectric rupture antifuses (if present), and a portion of one of the second conductors 400. The resulting structure is a bottom or first level of memory cells. Additional memory levels can be monolithically formed above the first, as described in the '470 application and the other incorporated references, forming a monolithic three dimensional memory array. For example, a second plurality of pillars can be formed above the upper conductors, and a third plurality of conductors can be formed above them. The upper conductors of one memory level can serve as the lower conductors of an overlying memory level, or an interlevel dielectric can be formed between them.

A method has been described for forming first conductors above first pillars, the method comprising forming a substantially planar surface, the substantially planar surface coexposing first pillars and a first dielectric material between the first pillars; depositing a second dielectric material on the planar surface; etching a plurality of trenches in the second dielectric material, wherein the etch is selective between the first dielectric material and the second dielectric material; and forming the first conductors in the trenches. In this method, the step of forming the substantially planar surface comprises forming the first pillars separated by gaps, the gaps horizontally filled with a third dielectric material, the third dielectric material recessed relative to the first pillars; depositing the second dielectric material on the first pillars and the third dielectric material; and planarizing to form the substantially planar surface.

In regard to a monolithic three dimensional memory array, a method has been described for minimizing dielectric overetch in such an array, the method comprising: a) forming a first memory level by a method comprising: forming first bottom conductors; forming first pillars above the first bottom conductors, the first pillars separated by a first dielectric material; depositing a second dielectric material on the first pillars; etching trenches in the second dielectric material, wherein the etch is selective between the first dielectric material and the second dielectric material; and forming first top conductors in the trenches; and b) monolithically forming at least a second memory level above the first memory level.

Figure 11A:
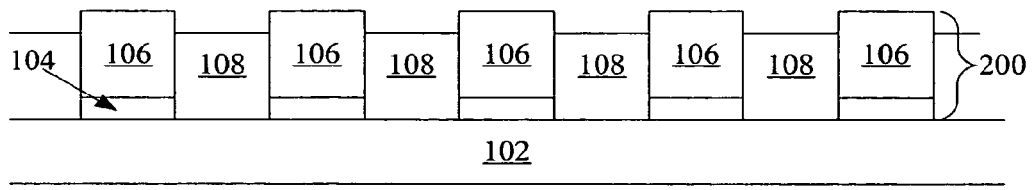
FIGS. 11a-11d are cross-sectional views illustrating stages in the formation of a vertical interconnect to make electrical connection to a conductor in which the methods of the present invention are used to prevent excessive dielectric overetch.

The methods of the present invention could also be used when forming vertical interconnects to conductors, for example, to bottom conductors 200. Turning to FIG. 11a, in a preferred embodiment, fabrication of conductors 200 begins as described earlier: Adhesion layer 104 and tungsten layer 106 are deposited on dielectric 102, then patterned and etched to form bottom conductors 200. Dielectric material 108, preferably silicon dioxide, is deposited over and between them, and a CMP step removes overfill, forming a substantially planar surface.

Figure 11B:
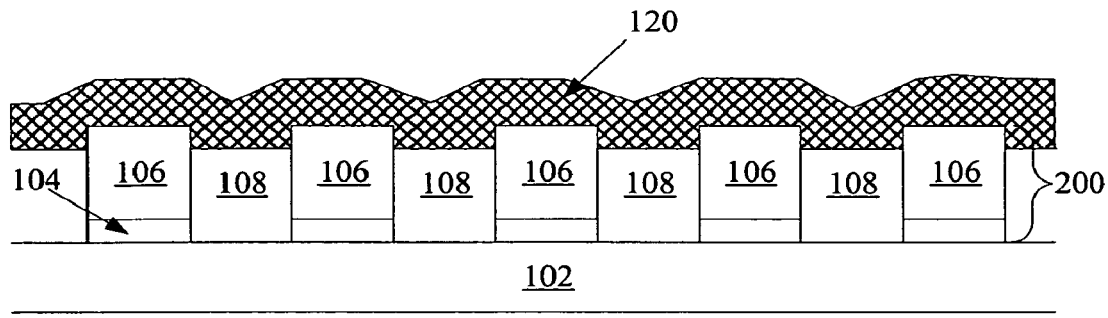

Using the methods of the present invention to prevent dielectric overetch at this surface, a selective etch is performed to recess silicon dioxide 108, preferably by an HF dip that removes about 500 angstroms of silicon dioxide 108, as shown in FIG. 11a. Next a second dielectric 120, preferably silicon nitride, is deposited, shown in FIG. 11b. In one embodiment the volume of silicon nitride 120 deposited is that required to form a thickness of 1000 angstroms on a flat surface.

A CMP step follows, removing the overfill of silicon nitride 120. Preferably this CMP is performed with a slurry having abrasive particles of fumed silica ($SiO_2$) in a pH of about 10 in KOH; an example of such a slurry is Cabot SS12. In preferred embodiments, the amount of CMP work sufficient to remove 1000 angstroms of oxide from an oxide-covered wafer with no topography is an advantageous amount to create the planarized surface 131, shown in FIG. 11c, coexposing silicon nitride 120 and the tops of conductors 200. If desired, other slurries could be used instead.

To summarize, forming this substantially planar surface 131 comprised: depositing a layer or stack of conductive or semiconductor material; patterning and etching the layer or stack of conductive or semiconductor material to form the conductive or semiconductor features; depositing a third dielectric material between the conductive or semiconductor features; and planarizing to coexpose the third dielectric material and the conductive or semiconductor features.

Figure 11D:
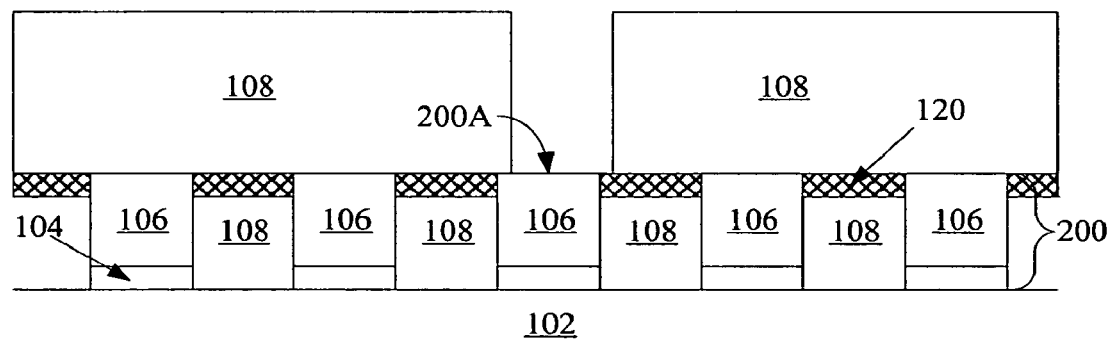
Figure 12:
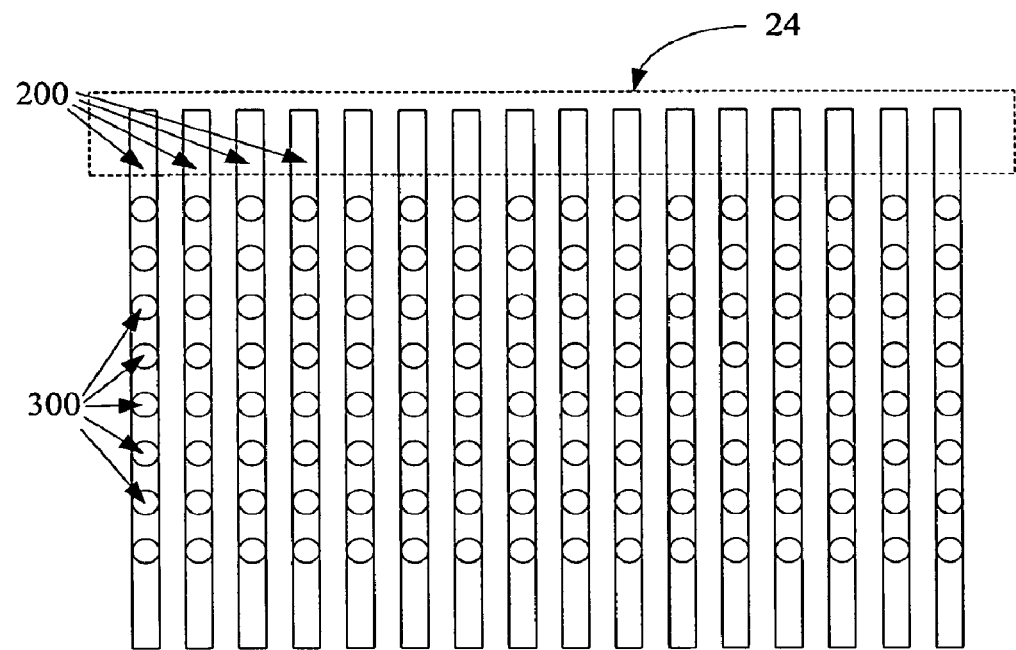
FIG. 12 is a plan view illustrating a possible location of the vertical interconnect formed as described in FIGS. 11a-11d.

FIG. 12 shows a portion of an exemplary array, including pillars 300, in plan view, in which conductors 200 extend past the array area. Electrical contact can be made to conductors 200 outside of the array area, for example in area 24. FIG. 11d shows a set of conductors 200 extending beyond the end of the array area in cross section. An etch is performed to etch through dielectric material 108, exposing conductive layer 106 of one of the conductors 200, conductor 200A. As shown in FIG. 11d, the etch may be slightly misaligned. The portion of the etched region that does not fall on the top surface of conductor 200A will stop on silicon nitride etch stop layer 120.

A conductive material can then be deposited in the etched void to form an electrical connection to conductor 200A. Such a via may connect device levels in a monolithic three dimensional array.

Figure 11C:
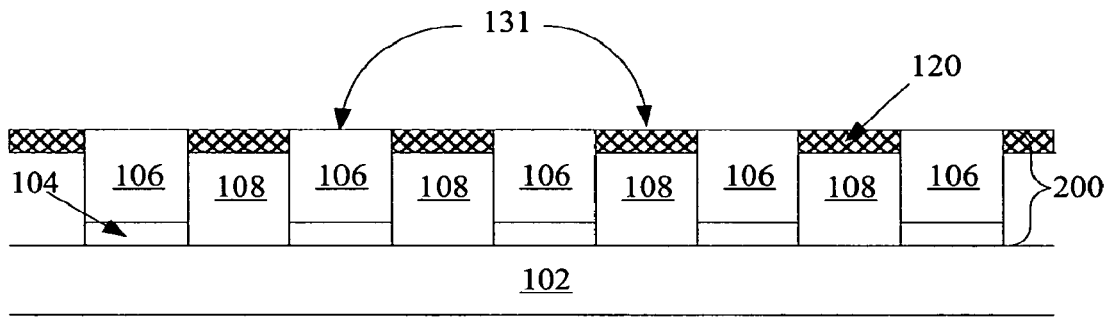
Figure 13A:
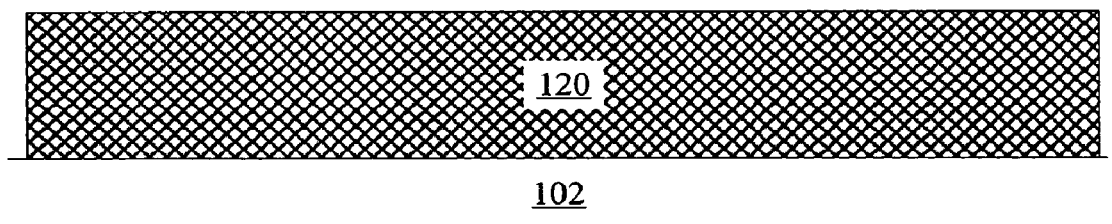
FIGS. 13a-13c are cross-sectional views illustrating a different fabrication method in an embodiment of the present invention.
Figure 13B:
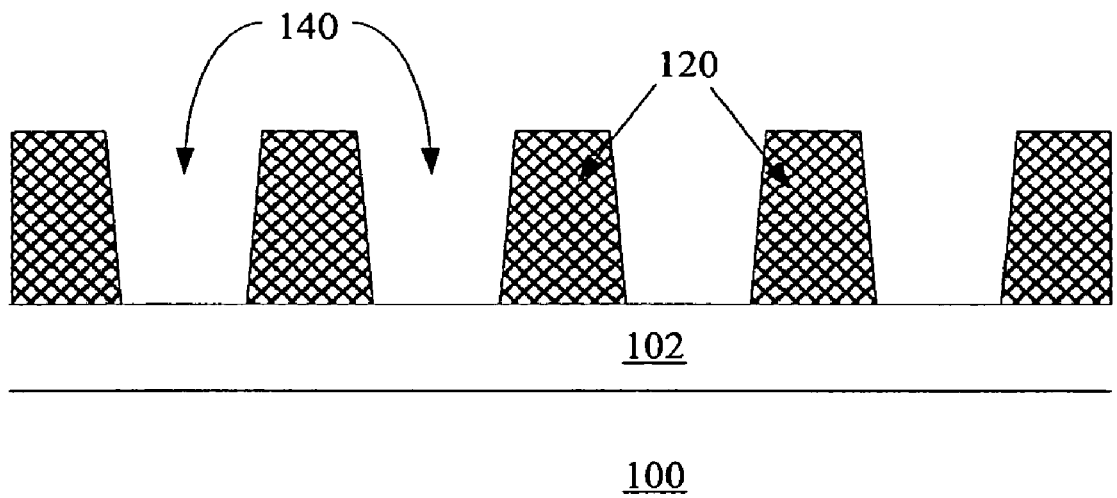
Figure 13C:
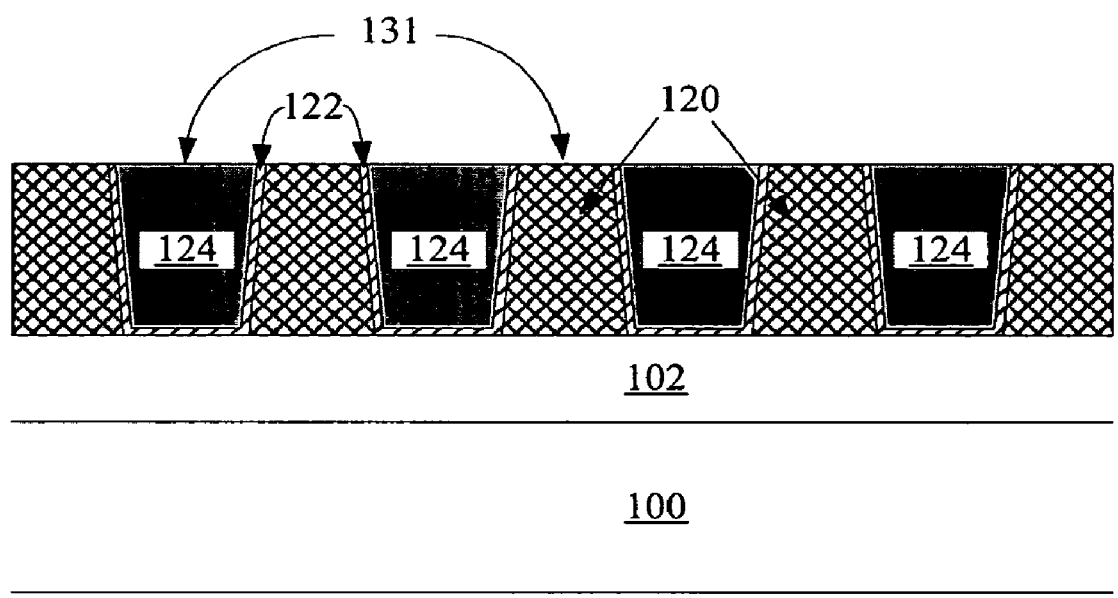

It will be understood that the surface 131 coexposing silicon nitride 120 and conductors 200 shown in FIG. 11c can be formed in different ways. For example, bottom conductors 200 can be formed by a damascene method. Turning to FIG. 13a, suppose a silicon nitride layer 120 is deposited on silicon wafer 100 and dielectric 102. Silicon nitride layer 120 is about 4000 to about 10,000 angstroms thick, preferably between about 4000 and about 5000 angstroms thick. Trenches 140, shown in FIG. 13b, are etched in silicon nitride layer 120. As shown in FIG. 13c, conductive material, for example titanium nitride layer 104 (deposited to a thickness between about 20 and about 1000 angstroms, preferably about 100 angstroms) and tungsten layer 106 (deposited to a thickness between about 1000 and about 5000 angstroms, preferably about 2000 angstroms), are deposited in the trenches and on silicon nitride layer 120. A CMP step removes the titanium nitride and tungsten overfill, leaving conductors 200 and creating substantially planar surface 131 which coexposes silicon nitride 120 and the tops of conductors 200. If a different dielectric, for example silicon dioxide, is deposited on planar surface 131, an etch through that silicon dioxide layer performed to make contact to conductors 200 will stop on silicon nitride 120 in case of misalignment. Many other variations which fall in the scope of the invention can be envisioned.

This example described use of the methods of the present invention to prevent dielectric overetch when making electrical connection to rail-shaped conductors, for example to conductors 200 formed within the array. In preferred embodiments, electrical connections must also be made to routing layers formed above the substrate and below the bottom conductors 200 of the lowest memory level. The methods of the present invention can advantageously be used when making electrical connection to the rail-shaped conductors of these routing layers. Such conductors can also be formed as described, with their top surfaces coplanar with a dielectric etch stop layer that will prevent or limit dielectric overetch.

In addition to the applications previously incorporated, monolithic three dimensional memory arrays are described in Johnson et al., U.S. Pat. No. 6,034,882, "Vertically Stacked Field Programmable Nonvolatile Memory and Method of Fabrication"; Lee et al., U.S. patent application Ser. No. 09/927,648, "Monolithic Three Dimensional Array of Charge Storage Devices Containing a Planarized Surface," filed Aug. 13, 2001; Walker et al., U.S. patent application Ser. No. 10/335,089, "Method for Fabricating Programmable Memory Array Structures Incorporating Series-Connected Transistor Strings," filed Dec. 31, 2002; Petti et al., U.S. patent application Ser. No. 10/728,230, "Semiconductor Device Including Junction Diode Contacting Contact-Antifuse Unit Comprising Silicide," filed Dec. 3, 2003; and Petti, U.S. patent application Ser. No. 10/955,387, "Fuse Memory Cell Comprising a Diode, the Diode Serving as the Fuse Element," filed Sep. 29, 2004, all hereby incorporated by reference. Where appropriate, the methods of the present invention could be employed in formation of any such memories.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The invention has been described in the context of a monolithic three dimensional memory array. As will be apparent to those skilled in the art, however, the methods of the present invention can be advantageously used in any context in which dielectric overetch is to be avoided. Clearly the utility of such an approach is in no way limited to memory or to three dimensional devices.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for reducing dielectric overetch, the method comprising:
    forming a substantially planar surface, wherein the planar surface coexposes conductive or semiconductor features and a dielectric etch stop layer, and wherein forming the substantially planar surface comprises:
        forming an initial surface coexposing a third dielectric material and the conductive or semiconductor features;
        etching to recess the third dielectric material relative to the conductive or semiconductor features;
        depositing the dielectric etch stop layer on the third dielectric material and the conductive or semiconductor features; and
        planarizing to form the substantially planar surface;
    depositing second dielectric fill directly on the planar surface; and
    etching a void in the second dielectric fill, wherein the etch is selective between the second dielectric fill and the dielectric etch stop layer, wherein the etch stops on the dielectric etch stop layer.

2. The method of claim 1 wherein the dielectric etch stop layer comprises silicon nitride, silicon oxynitride, or silicon carbide.

3. The method of claim 1 wherein the step of forming the substantially planar surface comprises planarizing by CMP.

4. The method of claim 1 wherein the step of forming the substantially planar surface comprises a selective overetch.

5. The method of claim 1 wherein the second dielectric fill comprises silicon dioxide.

6. The method of claim 1 wherein the step of forming the initial surface comprises:
    depositing a layer or stack of conductive or semiconductor material;
    patterning and etching the layer or stack of conductive or semiconductor material to form the conductive or semiconductor features;
    depositing a third dielectric material between the conductive or semiconductor features; and
    planarizing to coexpose the third dielectric material and the conductive or semiconductor features.

7. The method of claim 1 wherein the conductive or semiconductor features are pillars.

8. The method of claim 7 wherein the pillars comprise vertically oriented diodes.

9. The method of claim 8 wherein each vertically oriented diode is an element of a memory cell.

10. The method of claim 9 wherein the memory cells reside in a monolithic three dimensional memory array.

11. A method for reducing dielectric overetch, the method comprising:
    forming a first surface, wherein the first surface coexposes conductive or semiconductor features and first dielectric fill;
    etching to recess the first dielectric fill relative to the conductive or semiconductor features;
    depositing a dielectric etch stop layer on the first dielectric fill and conductive or semiconductor features;
    planarizing to form a substantially planar surface, wherein the substantially planar surface coexposes the conductive or semiconductor features and the dielectric etch stop layer;
    depositing second dielectric fill on the planar surface; and
    etching a void in the second dielectric fill wherein the etch is selective between the second dielectric fill and the dielectric etch stop layer, wherein the etch stops on the dielectric etch stop layer.

12. The method of claim 11 wherein the dielectric etch stop layer comprises silicon nitride, silicon oxynitride, or silicon carbide.

13. The method of claim 11 wherein the second dielectric fill comprises silicon dioxide.

14. The method of claim 11 wherein the planarizing step comprises planarizing by CMP.

15. The method of claim 11 wherein the planarizing step comprises nonselective etchback.

16. The method of claim 11 wherein the step of forming the first surface comprises:
    forming conductive or semiconductor features;
    filling gaps between the conductive or semiconductor features with the first dielectric fill, wherein the first dielectric fill is HDP dielectric, wherein the HDP dielectric is overfilled to create a substantially planar HDP fill surface; and
    etching the substantially planar HDP fill surface to expose the conductive or semiconductor features.

17. The method of claim 11 wherein the conductive or semiconductor features are pillars.

18. The method of claim 17 wherein the pillars comprise vertically oriented semiconductor diodes.

19. The method of claim 18 wherein each vertically oriented semiconductor diode is an element of a memory cell.

20. The method of claim 19 wherein the memory cells reside in a monolithic three dimensional memory array.

21. A method for forming first conductors above first pillars, the method comprising:
forming a substantially planar surface, the substantially planar surface coexposing first pillars and a first dielectric material between the first pillars, and wherein forming the substantially planar surface comprises:
forming the first pillars separated by gaps, the gaps horizontally filled with a third dielectric material, the third dielectric material recessed relative to the first pillars;
depositing the second dielectric material on the first pillars and the third dielectric material; and
planarizing to form the substantially planar surface;
depositing a second dielectric material on the planar surface;
etching a plurality of trenches in the second dielectric material, wherein the etch is selective between the first dielectric material and the second dielectric material; and
forming the first conductors in the trenches.

22. The method of claim 21 wherein the planarizing step comprises CMP.

23. The method of claim 21 wherein the planarizing step comprises, during the step of depositing the second dielectric material, overfilling with HDP dielectric until the HDP dielectric is substantially planar.

24. The method of claim 23 wherein the substantially planar HDP dielectric is removed by CMP or etchback, maintaining planarity to expose the first pillars, forming the substantially planar surface.

25. The method of claim 21 wherein each of the first pillars comprises a vertically oriented semiconductor diode.

26. The method of claim 25 wherein the semiconductor diodes comprise silicon and/or germanium.

27. The method of claim 21 wherein the first dielectric material comprises silicon nitride, silicon oxynitride, or silicon carbide.

28. The method of claim 27 wherein the second dielectric material comprises silicon dioxide.

29. The method of claim 21 wherein the step of forming the first pillars comprises:
depositing a semiconductor layer stack above underlying conductors; and
patterning and etching the semiconductor layer stack to form the first pillars.

30. The method of claim 21 further comprising forming second pillars above the first conductors.

31. The method of claim 21 wherein the first pillars and first conductors are elements of a first memory level.

32. The method of claim 31 further comprising forming at least a second memory level above the first memory level.

33. The method of claim 32 wherein the first and second memory levels are vertically stacked memory levels in a monolithic three dimensional memory array.

34. A method for minimizing dielectric overetch in a monolithic three dimensional memory array, the method comprising:
forming a first memory level by a method comprising:
forming first bottom conductors;
forming first pillars above the first bottom conductors, the first pillars separated by a first dielectric material, and wherein the step of forming first pillars comprises:
depositing a semiconductor layer stack
patterning and etching the semiconductor layer stack to form the first pillars;
depositing a third dielectric material, filling gaps between the first pillars;
planarizing to expose the first pillars and third dielectric etching to recess the third dielectric material relative to the first pillars;
depositing the first dielectric material on the first pillars and the third dielectric material; and
forming a substantially planar surface coexposing the first pillars and the first dielectric material;
depositing a second dielectric material on the first pillars;
etching trenches in the second dielectric material, wherein the etch is selective between the first dielectric material and the second dielectric material; and
forming first top conductors in the trenches; and
monolithically forming at least a second memory level above the first memory level.

35. The method of claim 34 wherein each of the first pillars comprises a vertically oriented semiconductor diode.

36. The method of claim 34 wherein the first memory level comprises a plurality of first memory cells, each memory cell comprising:
a portion of one of the first bottom conductors;
a first pillar; and
a portion of one of the first top conductors.

37. The method of claim 34 wherein the step of forming at least a second memory level above the first memory level comprises forming second pillars above the first top conductors.

* * * * *

UNITED STATES PATENT AND TRADEMARK OFFICE
CERTIFICATE OF CORRECTION

PATENT NO.        : 7,790,607 B2                                          Page 1 of 1
APPLICATION NO. : 11/923687
DATED             : September 7, 2010
INVENTOR(S)       : Samuel V. Dunton et al.

It is certified that error appears in the above-identified patent and that said Letters Patent is hereby corrected as shown below:

On the Title page, Item (56)

Page 2, U.S. PATENT DOCUMENTS, 9th entry, "0,221,200 A1 10/2005 Chen", should be changed to "2005-0221200 A1    10/2005 Chen"

Column 16, line 17, "depositing a semiconductor layer stack", should be changed to "depositing a semiconductor layer stack;"

Column 16, line 23, "tric etching to recess the third dielectric material", should be changed to "tric material;"

Column 16, line 24, "relative to the first pillars;", should be changed to "etching to recess the third dielectric material relative to the first pillars;"

Signed and Sealed this

Thirtieth Day of November, 2010

David J. Kappos
*Director of the United States Patent and Trademark Office*